US 9,391,237 B2

(12) United States Patent
Boyama

(10) Patent No.: US 9,391,237 B2
(45) Date of Patent: Jul. 12, 2016

(54) METHOD FOR PRODUCING GROUP III NITRIDE SEMICONDUCTOR LIGHT-EMITTING DEVICE

(71) Applicant: TOYODA GOSEI CO., LTD., Kiyosu-shi (JP)

(72) Inventor: Shinya Boyama, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 0 days.

(21) Appl. No.: 14/637,324

(22) Filed: Mar. 3, 2015

(65) Prior Publication Data

US 2015/0255678 A1   Sep. 10, 2015

(30) Foreign Application Priority Data

Mar. 4, 2014   (JP) ................................. 2014-041268

(51) Int. Cl.
*H01L 33/32* (2010.01)
*H01L 33/00* (2010.01)
*H01L 33/12* (2010.01)

(52) U.S. Cl.
CPC ............ *H01L 33/325* (2013.01); *H01L 33/007* (2013.01); *H01L 33/12* (2013.01)

(58) Field of Classification Search
CPC .... H01L 33/325; H01L 33/0075; H01L 33/14
USPC .......................................................... 438/46
See application file for complete search history.

(56) References Cited

U.S. PATENT DOCUMENTS

| 2004/0072383 | A1* | 4/2004 | Nagahama ........ H01L 21/76251 438/47 |
| 2006/0189017 | A1* | 8/2006 | Nogami ............ H01L 21/30612 438/46 |
| 2008/0296627 | A1* | 12/2008 | Watanabe ........... H01L 21/6835 257/200 |
| 2013/0017639 | A1* | 1/2013 | Boyama .............. H01L 21/0242 438/46 |
| 2013/0256687 | A1* | 10/2013 | Saito ....................... H01L 33/12 257/76 |

FOREIGN PATENT DOCUMENTS

| JP | 08-097471 A | 4/1996 |
| JP | 2010-087056 A | 4/2010 |
| JP | 2013-021173 A | 1/2013 |
| JP | 2013-128055 A | 6/2013 |

* cited by examiner

*Primary Examiner* — Karen Kusumakar
*Assistant Examiner* — Adam S Bowen
(74) *Attorney, Agent, or Firm* — McGinn IP Law Group, PLLC

(57) ABSTRACT

The present invention provides a Group III nitride semiconductor exhibiting reduced contact resistance. A first p-type contact layer of GaN doped with Mg is formed on a p-type cladding layer, using hydrogen as a carrier gas at a growth temperature of 850° C. to 1,050° C., so as to have a thickness of 10 nm to 300 nm. The Mg concentration is $1 \times 10^{19}/cm^3$ to $1 \times 10^{20}/cm^3$. Subsequently, a second p-type contact layer of GaN doped with Mg is formed, using nitrogen instead of hydrogen as a carrier gas at a temperature of 600° C. to 800° C. so as to have a thickness of two monolayers to 100 Å. The Mg concentration is $2 \times 10^{20}/cm^3$ to $1 \times 10^{21}/cm^3$.

8 Claims, 4 Drawing Sheets

FIG. 3A  Growth in an atmosphere of H2
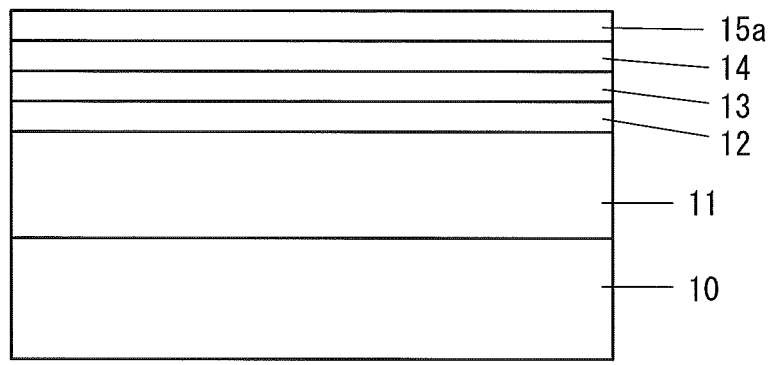
FIG. 3B  Temperature lowering in an atmosphere of NH3
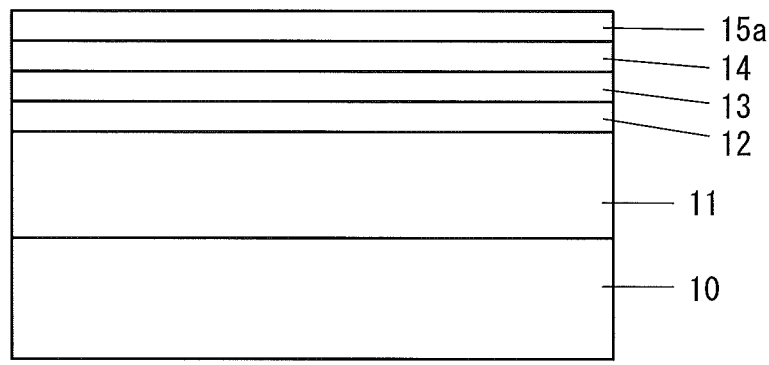
FIG. 3C  Growth in an atmosphere of N2
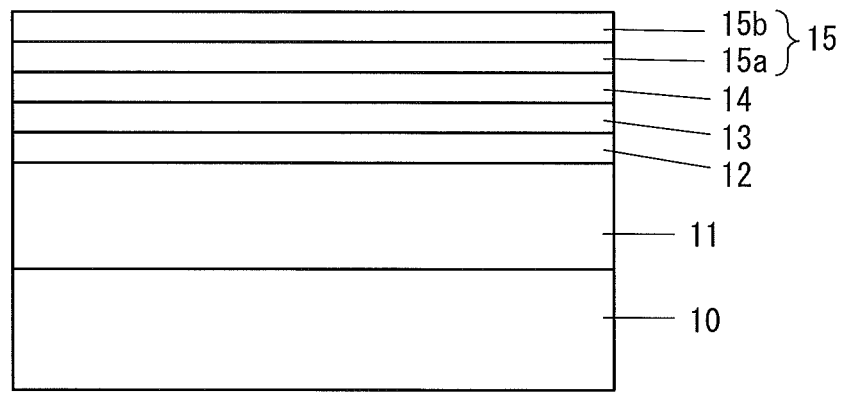

METHOD FOR PRODUCING GROUP III NITRIDE SEMICONDUCTOR LIGHT-EMITTING DEVICE

BACKGROUND OF THE INVENTION

1. Field of the Invention

The present invention relates to a method for producing a Group III nitride semiconductor light-emitting device, which is characterized by a method for forming a p-type contact layer.

2. Background Art

Patent Documents 1 to 4 disclose that a p-type contact layer has a two-layer structure in which a first p-type contact layer and a second p-type contact layer are sequentially deposited on a light-emitting layer to reduce the contact resistance between the p-type contact layer and an electrode in a Group III nitride semiconductor light-emitting device.

For example, Patent Documents 1 to 3 disclose a light-emitting device that the first and second p-type contact layers are both formed of Mg-doped GaN, and the second p-type contact layer has a Mg concentration higher than that of the first p-type contact layer. Thus, when the Mg concentration of the second p-type contact layer being in contact with an electrode is higher than that of the first p-type contact layer, the contact resistance is reduced. When the Mg concentration of the first p-type contact layer is lower than that of the second p-type contact layer, the carrier concentration is increased.

Patent Document 1 discloses that the Mg concentration of the first p-type contact layer is $1\times10^{20}/cm^3$, and the Mg concentration of the second p-type contact layer is $2\times10^{20}/cm^3$. Moreover, Patent Document 1 discloses that hydrogen or nitrogen is employed as carrier gases for forming the first and second p-type contact layers, and that the first and second p-type contact layers are both formed at a temperature of 850° C.

Patent Document 2 discloses a light-emitting device in which the first p-type contact layer has a Mg concentration of $1\times10^{19}/cm^3$ to $1\times10^{20}/cm^3$, and the second p-type contact layer has a Mg concentration of $1\times10^{20}/cm^3$ to $1\times10^{22}/cm^3$. A mixture gas of nitrogen and hydrogen is employed as a carrier gas for forming the first p-type contact layer, and hydrogen is employed as a carrier gas for forming the second p-type contact layer. The first p-type contact layer is formed at a growth temperature of 900° C. to 1,050° C., and the second p-type contact layer is formed at a growth temperature of 800° C. to 1,050° C.

Patent Document 3 discloses that the first and second p-type contact layers are both formed at a growth temperature of 800° C. to 900° C.

Patent Document 4 discloses a light-emitting device in which the first p-type contact layer is formed of Mg-doped GaN, and the second p-type contact layer is formed of Mg-doped InGaN. Moreover, nitrogen is employed as a carrier gas for forming the second p-type contact layer. InGaN has a work function smaller than that of GaN, which is closer to a work function of electrode material. Therefore, when the second p-type contact layer being in contact with the electrode is formed of InGaN, the contact resistance therebetween can be reduced.

Patent Document 1: Japanese Patent Application Laid-Open (kokai) No. H8-97471
Patent Document 2: Japanese Patent Application Laid-Open (kokai) No. 2013-128055
Patent Document 3: Japanese Patent Application Laid-Open (kokai) No. 2010-87056
Patent Document 4: Japanese Patent Application Laid-Open (kokai) No. 2013-21173

However, the contact resistance was not sufficiently reduced by the method for forming the p-type contact layer having the conventional two-layer structure disclosed in the above Patent Documents 1 to 4. Therefore, further reduction of contact resistance was needed. When the second p-type contact layer is formed of InGaN, the light output is reduced although the contact resistance can be reduced. Therefore, the second p-type contact layer is preferably formed of GaN.

SUMMARY OF THE INVENTION

Accordingly, an object of the present invention is to provide a Group III nitride semiconductor light-emitting device exhibiting reduced contact resistance between a p-type contact layer and an electrode when the p-type contact layer has a layered structure of a first p-type contact layer formed of GaN doped with Mg and a second p-type contact layer formed of GaN doped with Mg at a concentration higher than that of the first p-type contact layer.

The present invention provides a method for producing a Group III nitride semiconductor light-emitting device having a first p-type contact layer of GaN doped with Mg and a second p-type contact layer formed of GaN doped with Mg at a concentration higher than that of the first p-type contact layer on the first p-type contact layer, the method comprising the steps of:

forming the first p-type contact layer through MOCVD using hydrogen as a carrier gas at a temperature of 850° C. to 1,050° C.; and forming the second p-type contact layer through MOCVD using nitrogen as a carrier gas at a temperature of 600° C. to 800° C. on the first p-type contact layer after forming the first p-type layer.

In the forming of the first p-type layer, "using hydrogen as a carrier gas" means that the main composition of carrier gas is hydrogen. A mixture gas of hydrogen and nitrogen may be employed as a carrier gas. In that case, hydrogen ratio is 90 mol % or more, preferably, 95 mol % or more. However, only hydrogen is preferably employed than a mixture gas as a carrier gas.

In the forming of the second p-type layer, "using nitrogen as a carrier gas" means that the main composition of carrier gas is nitrogen. A mixture gas of hydrogen and nitrogen may be employed as a carrier gas. In that case, nitrogen ratio is 90 mol % or more, preferably, 95 mol % or more. However, only nitrogen is preferably employed than a mixture gas as a carrier gas.

After the completion of forming the first p-type layer and before starting to form the second p-type layer, there may be lowering of a temperature to a growth temperature for the second p-type contact layer in an ammonia atmosphere. Lowering of temperature in an ammonia atmosphere can suppress nitrogen from being released from the first p-type contact layer during lowering of temperature.

The second p-type contact layer is preferably formed so as to have a thickness of two monolayers to 100 Å. This can reduce the contact resistance. The thickness of one monolayer of GaN corresponds to ½ of the c-axis lattice constant of GaN, and the thickness of two monolayers is 5.185 Å. The thickness of the second p-type contact layer is, more preferably, two monolayers to 50 Å, and, further preferably, two monolayers to 30 Å.

The second p-type contact layer is preferably formed at a growth rate slower than that of the first p-type contact layer. This facilitates controlling the thickness of the second p-type contact layer.

Preferably, the first p-type contact layer has a Mg concentration of $1\times10^{19}/cm^3$ to $1\times10^{20}/cm^3$, and the second p-type contact layer has a Mg concentration of $2\times10^{20}/cm^3$ to $1\times10^{21}/cm^3$. This can reduce the contact resistance. The Mg concentration of the first p-type contact layer is, more preferably, $5\times10^{19}/cm^3$ to $1\times10^{20}/cm^3$, and, further preferably, $8\times10^{19}/cm^3$ to $1\times10^{20}/cm^3$. The Mg concentration of the second p-type contact layer is, more preferably, $5\times10^{20}/cm^3$ to $1\times10^{21}/cm^3$, and, further preferably, $8\times10^{20}/cm^3$ to $1\times10^{21}/cm^3$.

The present invention can prevent deterioration of the second p-type contact layer due to a high-temperature hydrogen atmosphere since the second p-type contact layer is formed in a nitrogen atmosphere. As a result, the contact resistance can be reduced.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which:

FIGS. 3A to 3C are sketches showing processes for forming a p-type contact layer 15;

DETAILED DESCRIPTION OF PREFERRED EMBODIMENT

A specific embodiment of the present invention will next be described with reference to the drawings. However, the present invention is not limited to the embodiment.

Embodiment 1

[Device Structure]

Figure 1:
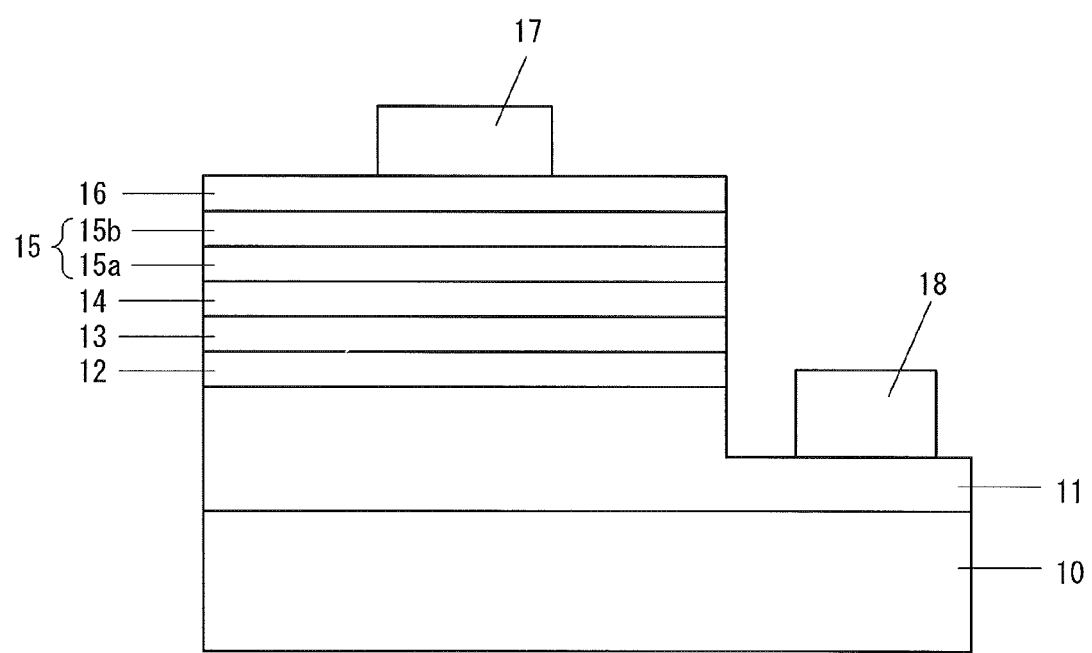
FIG. 1 shows the structure of a light-emitting device according to Embodiment 1.

FIG. 1 shows the structure of a Group III nitride semiconductor light-emitting device according to Embodiment 1. As shown in FIG. 1, the light-emitting device according to Embodiment 1 is a face-up type light-emitting device comprising a sapphire substrate 10, an n-type contact layer 11 disposed on the sapphire substrate 10, an n-type cladding layer 12 disposed on the n-type contact layer 11, a light-emitting layer 13 disposed on the n-type cladding layer 12, a p-type cladding layer 14 disposed on the light-emitting layer 13, a p-type contact layer 15 disposed on the p-type cladding layer 14, a transparent electrode 16 disposed on a part of the p-type contact layer 15, a p-electrode 17, and an n-electrode 18.

The sapphire substrate 10 is a growth substrate for crystal growing Group III nitride semiconductor on a main surface thereof. The main surface is, for example, an a-plane or c-plane. On the surface of the sapphire substrate 10, unevenness of concave and convex may be formed in a dot pattern or a stripe pattern to improve light extraction performance. The sapphire substrate 10 may be replaced with a substrate formed of, for example, GaN, SiC, ZnO, or Si.

The n-type contact layer 11 is disposed via an AlN buffer layer (not illustrated) on the uneven surface having concave and convex structure of the sapphire substrate 10. The n-type contact layer 11 is formed of, for example, n-GaN having a Si concentration of $1\times10^{18}/cm^3$ or more. The n-type contact layer 11 may comprise a plurality of layers having different Si concentrations.

The n-type cladding layer 12 is disposed on the n-type contact layer 11. The n-type cladding layer 12 has a superlattice structure in which an InGaN layer and an n-GaN layer are alternately and repeatedly deposited. An ESD layer for improving electrostatic breakdown voltage may be provided between the n-type contact layer 11 and the n-type cladding layer 12. The ESD layer, for example, has a layered structure in which an non-doped GaN layer and an n-GaN layer are sequentially deposited on the n-type contact layer 11.

The light-emitting layer 13 has a MQW structure in which a plurality of layer units are repeatedly deposited, each layer unit comprising an InGaN well layer, a protective layer, and an AlGaN barrier layer deposited in this order. The number of repetitions is three to ten times. The n-type cladding layer 12 and the p-type cladding layer 14 are both in contact with the respective nearest layers of the barrier layers. The protective layer is formed of GaN or AlGaN having a bandgap equal to or less than that of the barrier layer.

The p-type cladding layer 14 is disposed on the light-emitting layer 13. The p-type cladding layer 14 has a superlattice structure in which a p-InGaN layer and a p-AlGaN layer are alternately and repeatedly deposited. The number of repetitions is three to fifty times. The $p\text{-}In_xGa_{1-x}N$ layer has an In composition ratio x of 5% to 12%, and a thickness of 2 nm. The $p\text{-}Al_yGa_{1-y}N$ layer has an Al composition ratio y of 25% to 40%, and a thickness of 2.5 nm.

The p-type contact layer 15 is disposed on the p-type cladding layer 14. The p-type contact layer 15 has a two-layer structure in which a first p-type contact layer 15a and a second p-type contact layer 15b are sequentially deposited on the p-type cladding layer 14.

The first p-type contact layer 15a is formed of p-GaN having a Mg concentration of $1\times10^{19}/cm^3$ to $1\times10^{20}/cm^3$. Such a Mg concentration can achieve a high carrier concentration without deteriorating crystallinity. The first p-type contact layer 15a has a thickness of 10 nm to 300 nm.

The Mg concentration of the first p-type contact layer 15a is, more preferably, $5\times10^{19}/cm^3$ to $1\times10^{20}/cm^3$, and, further preferably, $8\times10^{19}/cm^3$ to $1\times10^{20}/cm^3$. Moreover, the thickness of the first p-type contact layer 15a is, more preferably, 30 nm to 200 nm, and, further preferably, 50 nm to 100 nm.

The second p-type contact layer 15b is formed of p-GaN having a Mg concentration of $2\times10^{20}/cm^3$ to $1\times10^{21}/cm^3$, and a transparent electrode 16 is disposed in contact therewith and thereon. The second p-type contact layer 15b has a thickness of two monolayers to 100 Å. The thickness of one monolayer of GaN corresponds to ½ of the c-axis lattice constant of GaN, and the thickness of two monolayers is 5.185 Å. When the second p-type contact layer 15b has a Mg concentration higher than that of the first p-type contact layer 15a, the crystallinity of the second p-type contact layer 15b is more deteriorated than that of the first p-type contact layer 15a. However, as mentioned above, the second p-type contact layer 15b is thin enough, and the area where the crystallinity is deteriorated is small enough to reduce the contact resistance between the second p-type contact layer 15b and the transparent electrode 16.

The Mg concentration of the second p-type contact layer 15b is, more preferably, $5 \times 10^{20}/cm^3$ to $1 \times 10^{21}/cm^3$, and, further preferably, $8 \times 10^{20}/cm^3$ to $1 \times 10^{21}/cm^3$. The thickness of the second p-type contact layer 15b is, more preferably, two monolayers to 50 Å, and further preferably, two monolayers to 30 Å.

The transparent electrode 16 is disposed in contact with and on the surface of the second p-type contact layer 15b. The transparent electrode 16 may be formed of, for example, transparent conductive oxide such as ITO (Indium Tin Oxide), IZO (Indium Zinc Oxide), ICO (Indium Cerium Oxide), and ZnO, transparent conductive nitride such as ZrN and TiN, and carbon-based material such as graphene and carbon nanotube.

The p-electrode 17 is disposed on the transparent electrode 16. The n-electrode 18 is disposed on the n-type contact layer 11 exposed in the bottom surface of a trench. The trench is provided by removing a part of the semiconductor layer (layered structure from the n-type contact layer 11 to the p-type contact layer 15), and has a depth extending from the surface of the second p-type contact layer 15b to the n-type contact layer 11. The p-electrode 17 and the n-electrode 18 have a pad portion to which a wire is connected, and a wiring portion continuous with the pad portion, which extends in a linear pattern.

[Production Process of Light-Emitting Device]

Next will be described processes for producing the light-emitting device according to Embodiment 1 with reference to FIGS. 2A to 2D and FIGS. 3A to 3C. Group III nitride semiconductor is crystal grown through normal pressure MOCVD. The raw material gases employed in MOCVD are as follows: ammonia ($NH_3$) as a nitrogen source; trimethylgallium (TMG; $Ga(CH_3)_3$) as a Ga source; trimethylindium (TMI; $In(CH_3)_3$) as an In source; trimethylaluminum (TMA; $Al(CH_3)_3$) as an Al source; silane ($SiH_4$) as an n-type doping gas; bis(cyclopentadienyl)magnesium ($Cp_2Mg$; $Mg(C_5H_5)_2$) as a p-type doping gas; and hydrogen ($H_2$) and nitrogen ($N_2$) as carrier gases. Needless to say, other materials employed for crystal growth of Group III nitride semiconductor in the conventional MOCVD may be employed as raw material gases.

Firstly, a sapphire substrate 10 is prepared, and the sapphire substrate 10 is heated in a hydrogen atmosphere for surface cleaning.

Next, an AlN buffer layer (not illustrated) is formed through MOCVD at 400° C. on the sapphire substrate 10. GaN or AlGaN may be used other than AlN as a buffer layer. Subsequently, an n-type contact layer 11 is formed at a growth temperature of 1,100° C. on the buffer layer through MOCVD using hydrogen as a carrier gas (refer to FIG. 2A).

Figure 2A:
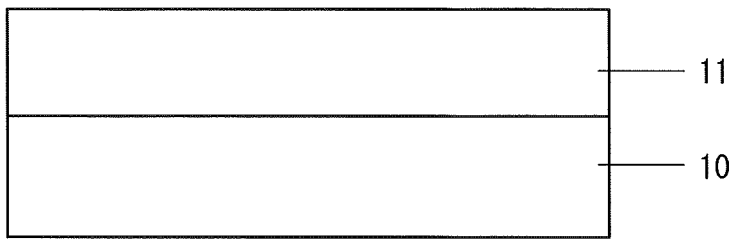
FIGS. 2A to 2D are sketches showing processes for producing the light-emitting device according to Embodiment 1.
Figure 2B:
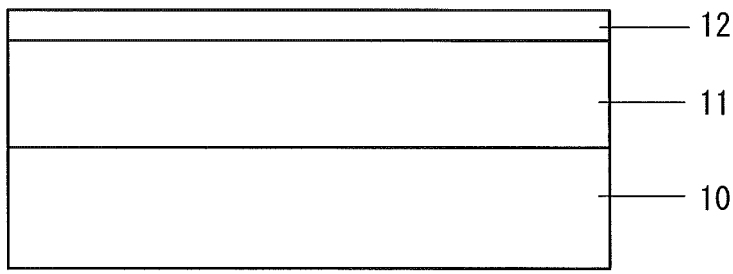

Then, an n-type cladding layer 12 is formed on the n-type contact layer 11, through MOCVD using hydrogen as a carrier gas (refer to FIG. 2B). The n-type cladding layer 12 is formed by alternately and repeatedly depositing an InGaN layer having a thickness of 2.5 nm and an n-GaN layer having a thickness of 2.5 nm. The number of repetitions is ten to twenty times. The growth temperature is 830° C. When InGaN is formed, nitrogen or a mixture gas of nitrogen and hydrogen may be employed as a carrier gas. In the case of nitrogen, damage to the well layer is suppressed, thereby improving crystal quality of InGaN.

Figure 2C:
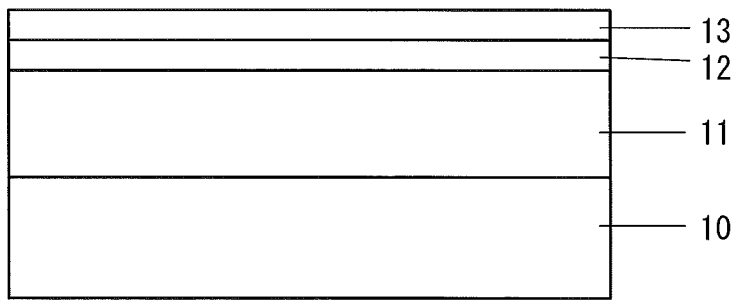

Subsequently, a light-emitting layer 13 is formed on the n-type cladding layer 12 through MOCVD (refer to FIG. 2C). The light-emitting layer 13 is formed by sequentially and repeatedly depositing a well layer of InGaN, a protective layer of GaN or AlGaN having a bandgap not higher than that of the barrier layer, and a barrier layer of AlGaN. The layer being in contact with the n-type cladding layer 12 (the bottom layer) and the top layer of the light-emitting layer are both the barrier layers. The number of repetitions is three to ten times. The well layer is formed at a growth temperature of 700° C. to 800° C. using nitrogen or a mixture gas of nitrogen and hydrogen as a carrier gas. The protective layer is grown at the same temperature employed for growing the well layer. The growth temperature of the barrier layer is 850° C. to 950° C. The protective layer and the barrier layer are formed, using hydrogen as a carrier gas. The protective layer formed between the well layer and the barrier layer, can suppress damage to the well layer during increasing a temperature for forming the barrier layer.

Figure 2D:
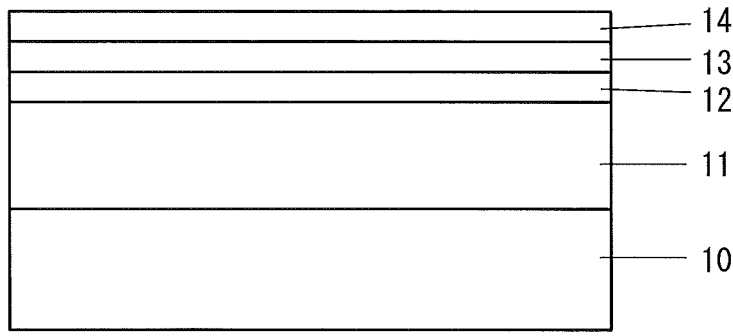

Subsequently, a p-type cladding layer 14 is formed through MOCVD on the light-emitting layer 13 (refer to FIG. 2D). The p-type cladding layer 14 is formed by repeatedly depositing a Mg-doped InGaN layer and a Mg-doped p-AlGaN layer. The number of repetitions is three to fifty times. hydrogen is employed as a carrier gas, and the growth temperature is 850° C. However, nitrogen or a mixture gas of nitrogen and hydrogen may be employed as a carrier gas for forming a Mg-doped InGaN layer.

Next, a first p-type contact layer 15a of GaN doped with Mg through MOCVD on the p-type cladding layer 14. Here, the first p-type contact layer 15a is crystal grown using hydrogen as a carrier gas in a hydrogen atmosphere (refer to FIG. 3A). The first p-type contact layer 15a is formed at a growth temperature is 850° C. to 1,050° C. so as to have a thickness of 10 nm to 300 nm. The flow rate of $Cp_2Mg$ is adjusted so that the Mg concentration is $1 \times 10^{19}/cm^3$ to $1 \times 10^{20}/cm^3$. Since hydrogen is employed as a carrier gas, the first p-type contact layer 15a can be grown with good crystallinity.

The growth temperature of the first p-type contact layer 15a is, more preferably, 950° C. to 1,050° C., and, further preferably, 1,000° C. to 1,050° C.

A mixture gas of hydrogen and nitrogen may be employed as a carrier gas for forming the first p-type contact layer 15a. However, in that case, hydrogen ratio is 90 mol % or more, preferably, 95 mol % or more. However, only hydrogen is preferably employed than a mixture gas as a carrier gas.

Next, the supply of TMG, $Cp_2Mg$, and hydrogen as a carrier gas is stopped, and the temperature is lowered to a growth temperature of a second p-type contact layer 15b after the formation of the first p-type contact layer 15a. During lowering of temperature, ammonia is continuously supplied without stop. That is, the first p-type contact layer 15a is in an ammonia atmosphere during lowering of temperature (refer to FIG. 3B). This is to prevent nitrogen from being released from the first p-type contact layer 15a during lowering of temperature. As a result, the crystallinity of the first p-type contact layer 15a is not impaired, thereby improving emission performance.

Subsequently, nitrogen is supplied instead of hydrogen as a carrier gas, the supply of TMG and $Cp_2Mg$ is resumed, and a second p-type contact layer 15b of Mg-doped GaN is formed through MOCVD at a temperature of 600° C. to 800° C. so as to have a thickness of two monolayers to 100 Å (refer to FIG. 3C). The flow rate of $Cp_2Mg$ is adjusted so that the Mg concentration is $2 \times 10^{20}/cm^3$ to $1 \times 10^{21}/cm^3$.

In this way, in Embodiment 1, nitrogen is employed instead of hydrogen conventionally used as a carrier gas for forming the second p-type contact layer 15b. When hydrogen is employed as a carrier gas, the second p-type contact layer 15b is exposed to a high-temperature hydrogen atmosphere, and the second p-type contact layer 15b is deteriorated. Therefore, the contact resistance between the second p-type contact layer 15b and the transparent electrode 16 increases. On the other hand, when nitrogen is employed as a carrier gas and the growth temperature is 600° C. to 800° C. as in Embodiment 1, the second p-type contact layer 15b is not exposed to a high-temperature hydrogen atmosphere, thereby suppressing deterioration of the second p-type contact layer 15b. As a result, the contact resistance between the second p-type contact layer 15b and the transparent electrode 16 can be reduced.

The growth temperature of the second p-type contact layer 15b is, more preferably, 650° C. to 750° C., and, further preferably, 680° C. to 730° C.

Moreover, the flow rate of TMG for forming the second p-type contact layer 15b is preferably lower than that for forming the first p-type contact layer 15a. The growth rate of the second p-type contact layer 15b is lower than that of the first p-type contact layer 15a by suppressing the flow rate of TMG. This facilitates the thickness control of the second p-type contact layer 15b, thereby improving the crystallinity of the second p-type contact layer 15b. The growth rate of the second p-type contact layer 15b is, more preferably, 0.03 times to 0.1 times and, further preferably, 0.05 times to 0.07 times the growth rate of the first p-type contact layer 15a. The growth rate of the second p-type contact layer 15b is preferably 10 nm/min to 20 nm/min.

A mixture gas of hydrogen and nitrogen may be employed as a carrier gas for forming the second p-type contact layer 15b. However, nitrogen ratio is 90 mol % or more, preferably, 95 mol % or more. However, only nitrogen is preferably employed than a mixture gas as a carrier gas.

Figure 4A:
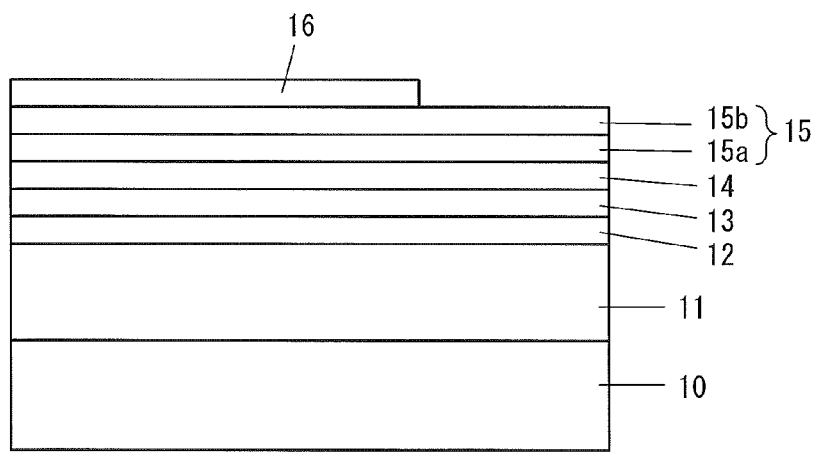
FIGS. 4A and 4B are sketches showing processes for producing the light-emitting device according to Embodiment 1.

Subsequently, a transparent electrode 16 is formed on a part of the second p-type contact layer 15b (area where a trench is not formed in the next process) by sputtering or vapor deposition (refer to FIG. 4A).

Figure 4B:
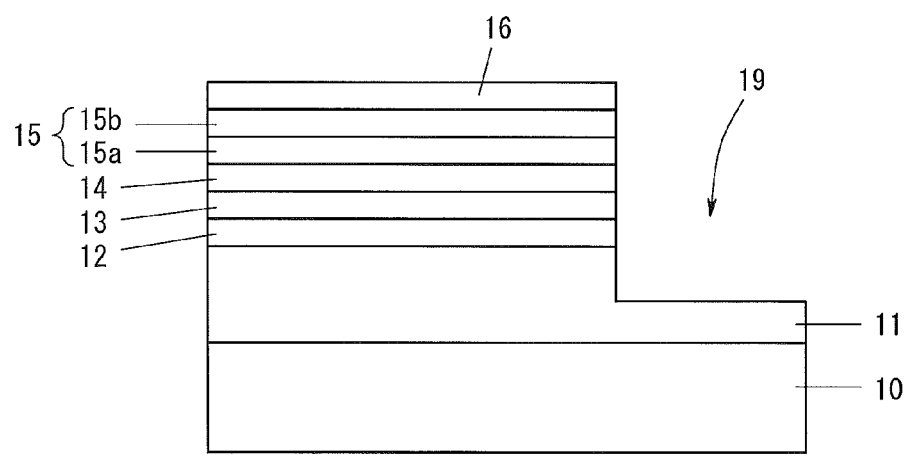

Then, a trench 19 having a depth reaching the n-type contact layer 11 is formed by dry etching the surface of the p-type contact layer 15b on which the transparent electrode 16 is not formed (refer to FIG. 4B). A transparent electrode 16 may be formed after the trench 19 is formed.

Next, a p-electrode 17 is formed by vapor deposition on the transparent electrode 16, and an n-electrode 18 is formed by vapor deposition on the n-type contact layer 11 exposed in the bottom surface of the trench 19. Either the p-electrode 17 or the n-electrode 18 may be formed first, and both may be simultaneously formed when both are formed of the same material. After that, Mg is activated by annealing in a nitrogen atmosphere, to obtain p-type conduction or p-type activation in the p-type cladding layer 14 and the p-type contact layer 15. P-type conduction may be obtained before the formation of the p-electrode 17 and the n-electrode 18. When ITO is used as the transparent electrode 16, and annealing is performed for the crystallization of ITO, annealing for the transparent electrode 16 and annealing for p-type conduction may be performed as the same process. Thus, the Group III nitride semiconductor light-emitting device according to Embodiment 1 shown in FIG. 1 is produced.

In the method for producing the light-emitting device according to Embodiment 1, when the second p-type contact layer 15b is formed, nitrogen is employed instead of hydrogen conventionally used, and the growth temperature is 600° C. to 800° C. Therefore, the second p-type contact layer 15b is grown in a nitrogen atmosphere instead of hydrogen atmosphere. Since the second p-type contact layer 15b is not exposed to a high-temperature hydrogen atmosphere unlike the conventional case, the deterioration of the second p-type contact layer 15b is suppressed. As a result, the contact resistance between the second p-type contact layer 15b and the transparent electrode 16 can be reduced.

EXAMPLE 1

Figure 5:
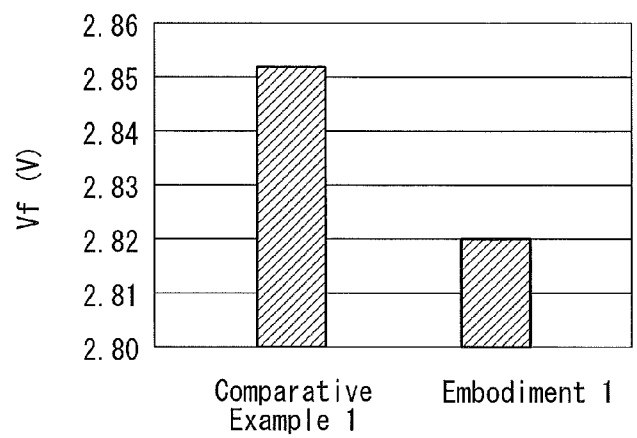
FIG. 5 is a graph comparing the forward voltage (Vf) of the light-emitting device according to Embodiment 1 and the forward voltage (Vf) of the light-emitting device of Comparative Example.

FIG. 5 is a graph comparing the forward voltage Vf of the light-emitting device according to Embodiment 1 and the forward voltage Vf of the light-emitting device of Comparative Example 1. Here, Vf is the value when the forward current (If) is 20 mA. In the light-emitting device according to Embodiment 1, ITO is used as a transparent electrode, and the second p-type contact layer 15b is formed at a growth temperature of 710° C. so as to have a thickness of 20 Å. The processes for producing the light-emitting device according to Comparative Example 1 are the same as the processes for producing the light-emitting device according to Embodiment 1 except that hydrogen conventionally used is employed instead of nitrogen as a carrier gas for forming the second p-type contact layer 15b.

As shown in FIG. 5, Vf was lower by 1.1% than the light-emitting device according to Embodiment 1 than the light-emitting device according to Comparative Example 1. It follows from this result that the contact resistance was reduced by employing nitrogen instead of hydrogen conventionally used as a carrier gas for forming the second p-type contact layer 15b.

The present invention is to reduce the contact resistance by suppressing the deterioration of the second p-type contact layer 15b. Therefore, the electrode being in contact with the second p-type contact layer 15b may be formed of any material. Materials other than those of the transparent electrode 16 described in Embodiment 1 may be employed. Even if a p-electrode formed of metal material is in contact with the second p-type contact layer 15b, the contact resistance between the second p-type contact layer 15b and the p-electrode can be reduced.

The present invention is not limited to the Group III nitride semiconductor light-emitting devices having the face-up type structure according to Embodiment 1, and can be applied to a Group III nitride semiconductor light-emitting device having any structure, so long as it has a p-type contact layer. For example, the present invention can be applied to a flip-chip type light-emitting device or a light-emitting device having a vertical conductive structure obtained by using a conductive substrate or removing a substrate by a laser lift-off technique.

The Group III nitride semiconductor light-emitting device of the present invention can be employed as a light source of an illumination apparatus or a display apparatus.

What is claimed is:

1. A method for producing a Group III nitride semiconductor light-emitting device having a first p-type contact layer formed of GaN doped with Mg, and a second p-type contact layer formed of GaN doped with Mg at a concentration higher than that of the first p-type contact layer on the first p-type contact layer, the method comprising the steps of:

forming the first p-type contact layer of GaN with a thickness in a range from 10 nm to 300 nm and a Mg concentration in a range from $8\times10^{19}/cm^3$ to $1\times10^{20}/cm^3$ through MOCVD using ammonia ($NH_3$) as a nitrogen source, trimethylgallium (TMG; $Ga(CH_3)_3$) as a Ga source, bis(cyclopentadienyl)magnesium ($Cp_2Mg$; $Mg(C_5H_5)_2$) as a p-type doping gas and hydrogen as a carrier gas at a temperature of 850° C. to 1,050° C.;

stopping supplies of the trimethylgallium, the bis(cyclopentadienyl)magnesium, and the hydrogen after a completion of the forming of the first p-type contact layer and keeping a flow rate of the ammonia at the same value as in the forming of the first p-type contact layer;

lowering a temperature to a growth temperature for the second p-type contact layer in an ammonia atmosphere after the completion of the forming of the first p-type contact layer and before starting to form the second p-type contact layer;

starting supplies of nitrogen as a carrier gas, the trimethylgallium, and the bis(cyclopentadienyl)magnesium;

forming the second p-type contact layer with a thickness in a range from two monolayers to 50 Å and a Mg concentration in a range from $5 \times 10^{20}/cm^3$ to $1 \times 10^{21}/cm^3$ through MOCVD using the nitrogen as the carrier gas at a temperature of 600° C. to 800° C. on the first p-type contact layer after the forming of the first p-type contact layer;

forming a transparent electrode on the second p-type contact layer;

wherein the second p-type contact layer is formed at a growth rate of 0.03 times to 0.1 times the growth rate of the first p-type contact layer by decreasing a flow rate of the trimethylgallium for the forming of the second p-type contact layer lower than a flow rate of the trimethylgallium for the forming of the first p-type contact layer.

2. The method for producing the Group III nitride semiconductor light-emitting device according to claim 1, wherein the second p-type contact layer has any thickness in a range from two monolayers to 30 Å.

3. The method for producing the Group III nitride semiconductor light-emitting device according to claim 1, wherein the second p-type contact layer has a Mg concentration in a range from $8 \times 10^{20}/cm^3$ to $1 \times 10^{21}/cm^3$.

4. The method for producing the Group III nitride semiconductor light-emitting device according to claim 1, wherein the first p-type contact layer has a thickness in a range from 30 nm to 200 nm.

5. The method for producing the Group III nitride semiconductor light-emitting device according to claim 1, wherein the first p-type contact layer has a thickness in a range from 50 nm to 100 nm.

6. The method for producing the Group III nitride semiconductor light-emitting device according to claim 1, wherein the second p-type contact layer is formed at a growth rate of 0.05 times to 0.07 times the growth rate of the first p-type contact layer.

7. The method for producing the Group III nitride semiconductor light-emitting device according to claim 1, wherein a transparent electrode comprises one member selected from a group consisting of Indium Tin Oxide, Indium Zinc Oxide, Indium Cerium Oxide, and ZnO.

8. The method for producing the Group III nitride semiconductor light-emitting device according to claim 1, wherein a growth rate of the second p-type contact layer is 10 nm/min to 20 nm/min.

* * * * *